(12) United States Patent
Huang

(10) Patent No.: US 12,435,542 B2
(45) Date of Patent: Oct. 7, 2025

(54) ELECTRIC LOCK AND HOUSING THEREOF

(71) Applicant: TAIWAN FU HSING INDUSTRIAL CO., LTD., Kaohsiung (TW)

(72) Inventor: Fu-Chih Huang, Kaohsiung (TW)

(73) Assignee: TAIWAN FU HSING INDUSTRIAL CO., LTD., Kaohsiung (TW)

( * ) Notice: Subject to any disclaimer, the term of this patent is extended or adjusted under 35 U.S.C. 154(b) by 92 days.

(21) Appl. No.: 18/525,229

(22) Filed: Nov. 30, 2023

(65) Prior Publication Data

US 2024/0218700 A1    Jul. 4, 2024

(30) Foreign Application Priority Data

Jan. 3, 2023 (TW) ................................. 112200031

(51) Int. Cl.
*E05B 9/02* (2006.01)
*E05B 47/00* (2006.01)
*E05B 9/00* (2006.01)

(52) U.S. Cl.
CPC ............ *E05B 47/0001* (2013.01); *E05B 9/02* (2013.01)

(58) Field of Classification Search
CPC ................. E05B 9/02; Y10T 292/0894; Y10T 292/0895; Y10T 292/0902; Y10T 292/62; E05C 19/06; Y10S 292/38; Y10S 292/53
USPC .................................... 70/443, 466; 220/281
See application file for complete search history.

(56) References Cited

U.S. PATENT DOCUMENTS

| | | | | |
|---|---|---|---|---|
| 2,577,248 A * | 12/1951 | James | .................... | B65D 5/685 229/920 |
| 3,759,415 A * | 9/1973 | Cloyd | ................ | B65D 43/0212 220/792 |
| 3,840,152 A * | 10/1974 | Hodge | ............... | B65D 43/0206 206/508 |
| 5,322,178 A * | 6/1994 | Foos | .................... | B65D 43/162 220/756 |
| 5,348,356 A * | 9/1994 | Moulton | ................. | E05B 37/20 292/87 |
| 5,575,399 A * | 11/1996 | Intini | ................... | B65D 51/245 220/835 |
| 5,577,779 A * | 11/1996 | Dangel | ................... | E05C 19/06 220/326 |
| 5,931,514 A * | 8/1999 | Chung | .................... | F16B 12/26 292/87 |
| 6,301,096 B1 * | 10/2001 | Wozniczka | .............. | H05K 5/15 361/740 |

(Continued)

*Primary Examiner* — Carlos Lugo
(74) *Attorney, Agent, or Firm* — Best & Flanagan LLP

(57) ABSTRACT

A housing of an electric lock includes a first casing having a first and a second side walls arranged at two opposite sides of the first casing, and a second casing mounted between the first and second side walls. The second casing is formed with a first buckle structure adjacent to the first side wall and a first rebound structure abutting against the first casing. The first buckle structure includes a first elastic arm extended along a height direction of the second casing, and a first protrusion protruded toward the first side wall. The first rebound structure is configured to push the second casing away from the first casing along the height direction. The first side wall is formed with a first blocking part configured to abut against the first protrusion to prevent the second casing from moving away from the first casing along the height direction.

7 Claims, 7 Drawing Sheets

(56) References Cited

U.S. PATENT DOCUMENTS

| | | | | |
|---|---|---|---|---|
| 6,315,142 B1* | 11/2001 | Kitamura | ............ | H04M 1/0252 |
| | | | | 220/326 |
| 6,920,976 B2* | 7/2005 | Sykes | ................ | G11B 33/0461 |
| | | | | 206/308.2 |
| 7,338,096 B2* | 3/2008 | Si | ............................ | E05C 19/06 |
| | | | | 292/87 |
| 7,988,014 B2* | 8/2011 | Jan | ....................... | B65D 43/021 |
| | | | | 220/281 |
| 8,648,264 B2* | 2/2014 | Masumoto | ............... | H02G 3/14 |
| | | | | 220/281 |
| 8,665,603 B2* | 3/2014 | Brieda | ................ | H05K 7/1417 |
| | | | | 361/752 |
| 8,752,911 B2* | 6/2014 | Dernier | .................... | H05K 5/15 |
| | | | | 361/679.01 |
| 9,097,037 B2* | 8/2015 | McKibben | .............. | E05B 63/04 |
| 10,895,094 B2* | 1/2021 | Li | ......................... | E05B 47/026 |
| 12,042,099 B2* | 7/2024 | Kunda | .................. | A47K 10/24 |
| 2002/0092331 A1* | 7/2002 | Huang | ................ | E05B 47/0012 |
| | | | | 70/278.2 |
| 2006/0158857 A1* | 7/2006 | Luckner | ............. | H01L 23/3675 |
| | | | | 257/E23.087 |

\* cited by examiner

ELECTRIC LOCK AND HOUSING THEREOF

BACKGROUND OF THE INVENTION

1. Field of the Invention

The present invention relates to a housing of an electric lock, and more particularly, to a housing of an electric lock with an improved structure.

2. Description of the Prior Art

Generally, a housing of an electric lock has an upper casing and a lower casing. A space between the upper casing and the lower casing is configured to accommodate related components of the electric lock, such as a driving module, a motor, a control circuit, etc. The upper casing and the lower casing are respectively formed with corresponding buckle structures for mounting the lower casing onto the upper casing. However, the buckle structures of the upper casing and the lower casing of the prior art are not easy to detach from each other, and are easily broken or damaged during disassembling process of the housing.

SUMMARY OF THE INVENTION

A housing of an electric lock of the present invention comprises a first casing having a first side wall and a second side wall arranged at two opposite sides of the first casing, and a second casing mounted between the first side wall and the second side wall, wherein an accommodating space is formed between the first casing and the second casing and configured to accommodate components of the electric lock. The second casing is formed with a first buckle structure adjacent to the first side wall, and a first rebound structure configured to abut against the first casing. The first buckle structure comprises a first elastic arm extended along a height direction of the second casing, and a first protrusion protruded from the first elastic arm and extended toward the first side wall. The first rebound structure is configured to provide an elastic force along the height direction to push the second casing away from the first casing along the height direction. The first side wall is formed with a first blocking part configured to abut against the first protrusion to prevent the second casing from moving away from the first casing along the height direction.

An electric lock of the present invention comprises a driving module, a motor connected to the driving module, a control circuit configured to control the motor to drive the driving module to drive a predetermined mechanism of the electric lock to move, and a housing. The housing comprises a first casing having a first side wall and a second side wall arranged at two opposite sides of the first casing, and a second casing mounted between the first side wall and the second side wall, wherein an accommodating space is formed between the first casing and the second casing and configured to accommodate the driving module, the motor and the control circuit. The second casing is formed with a first buckle structure adjacent to the first side wall, and a first rebound structure configured to abut against the first casing. The first buckle structure comprises a first elastic arm extended along a height direction of the second casing, and a first protrusion protruded from the first elastic arm and extended toward the first side wall. The first rebound structure is configured to provide an elastic force along the height direction to push the second casing away from the first casing along the height direction. The first side wall is formed with a first blocking part configured to abut against the first protrusion to prevent the second casing from moving away from the first casing along the height direction.

In contrast to the prior art, the housing of the electric lock of the present invention can be easily dissembled and assembled, and the first buckle structure and the second buckle structure are not easily broken or damaged during the disassembly process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
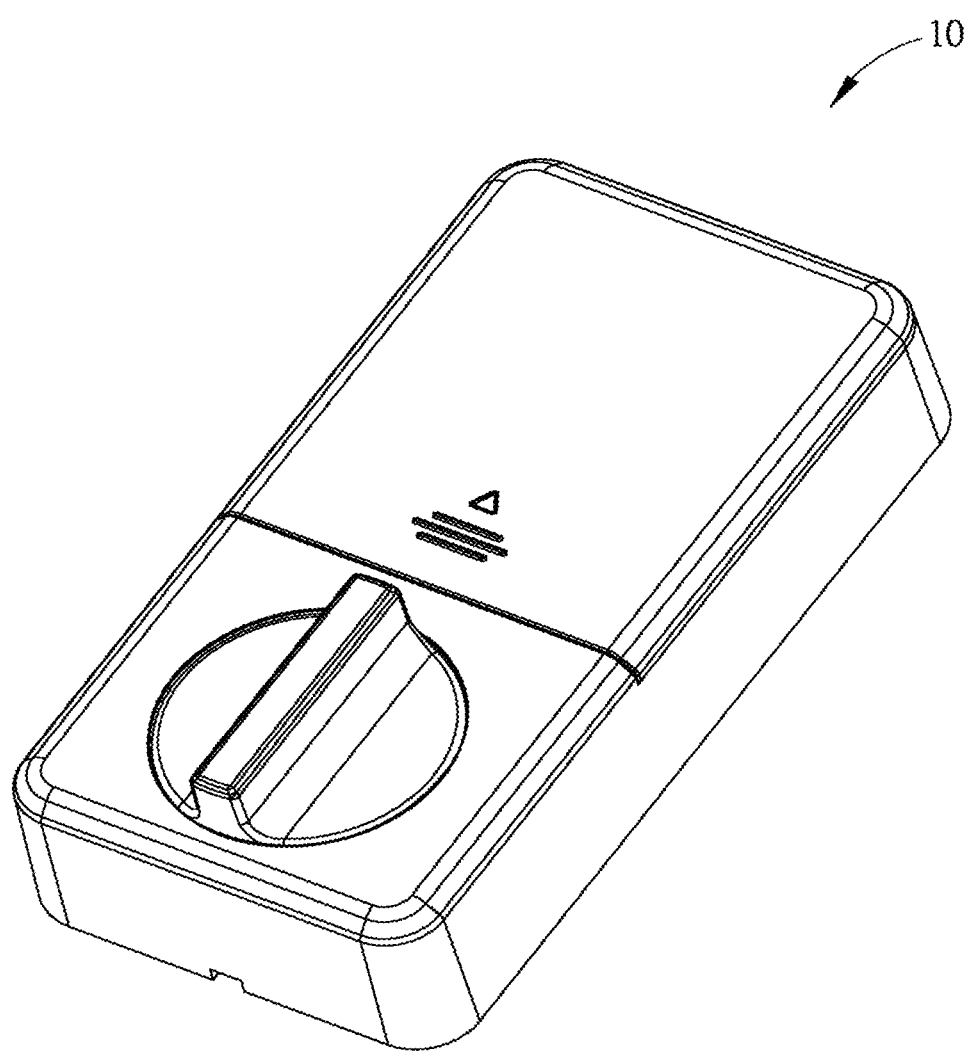
FIG. 1 is a diagram showing a front side of an electric lock of the present invention.
Figure 2:
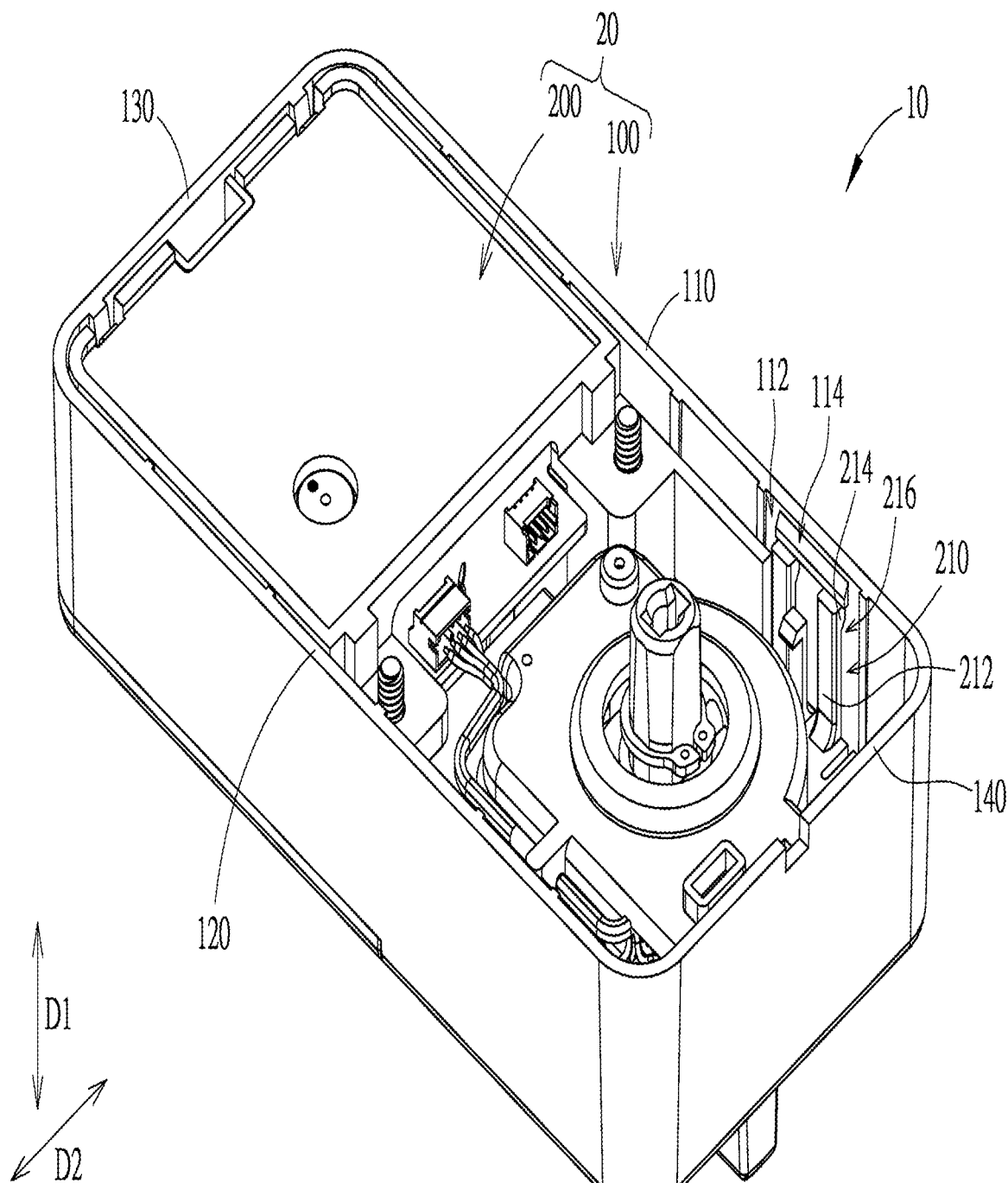
FIG. 2 is a diagram showing a rear side of the electric lock of the present invention.
Figure 3:
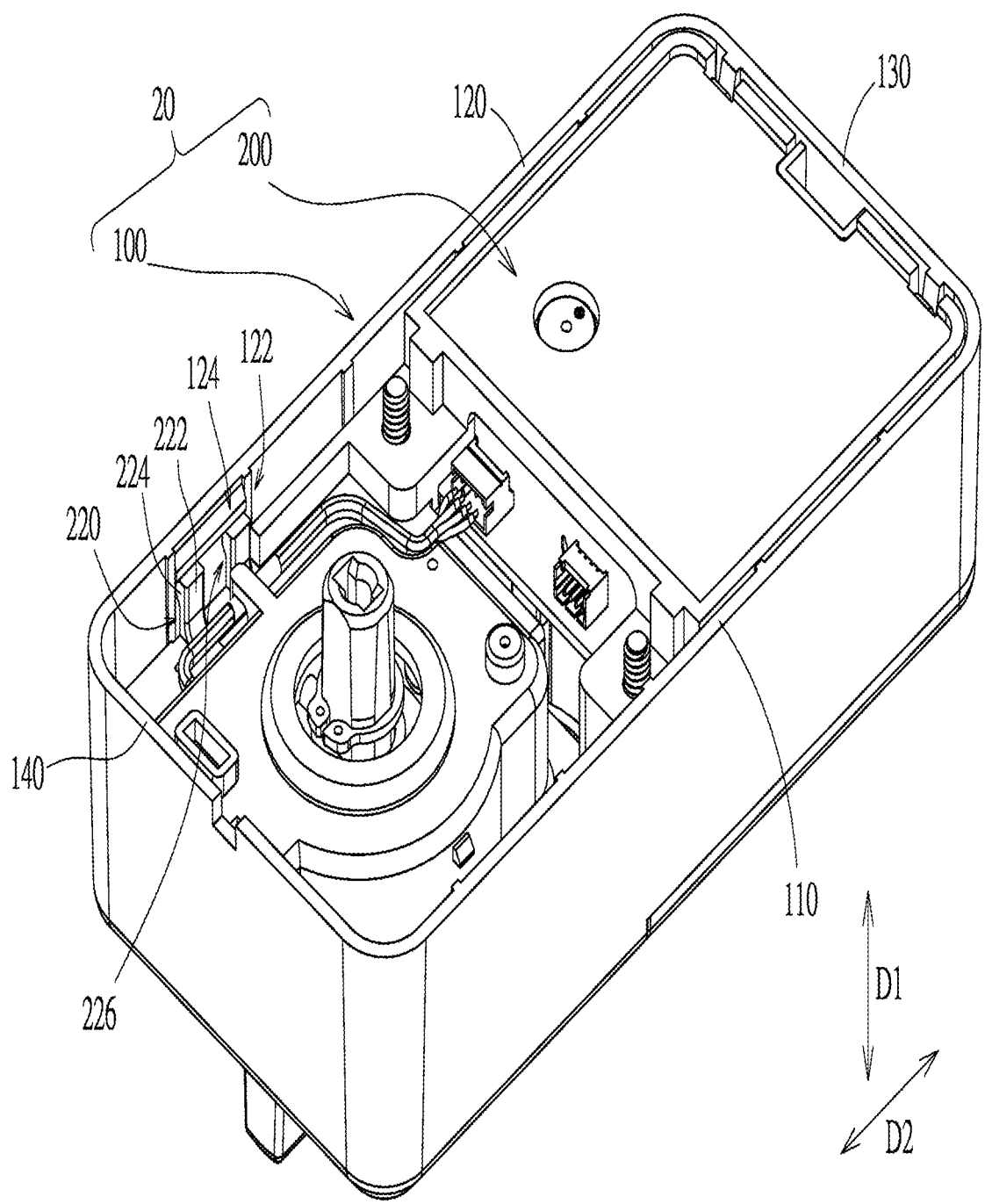
FIG. 3 is a diagram showing the rear side of the electric lock of the present invention from another viewing angle.
Figure 4:
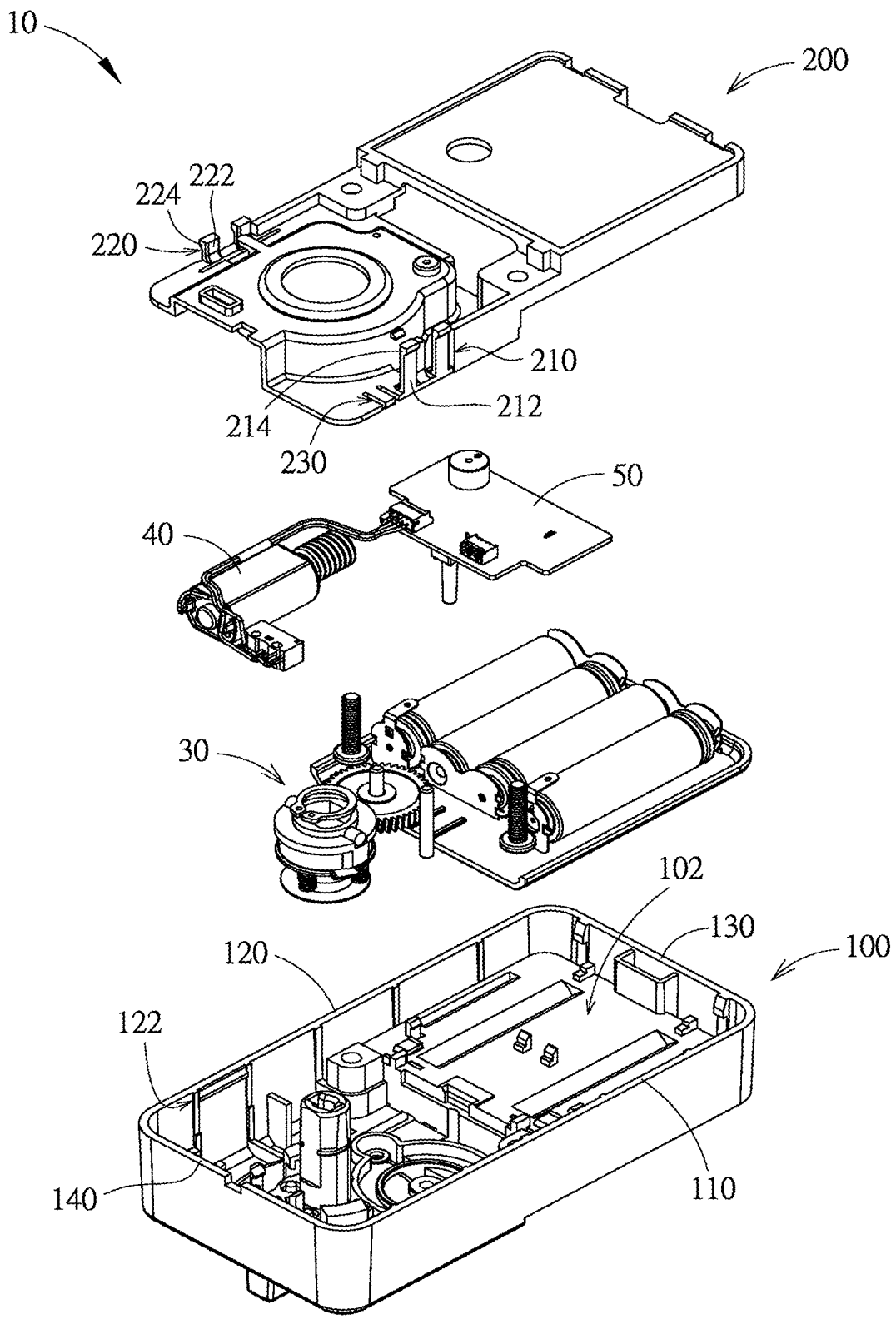
FIG. 4 is an exploded view of the electric lock of the present invention.

Please refer to FIG. 1 to FIG. 4. FIG. 1 is a diagram showing a front side of an electric lock of the present invention. FIG. 2 is a diagram showing a rear side of the electric lock of the present invention. FIG. 3 is a diagram showing the rear side of the electric lock of the present invention from another viewing angle. FIG. 4 is an exploded view of the electric lock of the present invention. As shown in figures, the electric lock 10 of the present invention comprises a housing 20, a driving module 30, a motor 40 and a control circuit 50. The housing 20 comprises a first casing 100 and a second casing 200. The first casing 100 has a main body 102, a first side wall 110, a second side wall 120, a third side wall 130 and a fourth side wall 140. The first to fourth side walls 110, 120, 130, 140 are extended from the main body 102 along a height direction D1 of the first casing 100. The first side wall 110 and the second side wall 120 are arranged at opposite sides of the first casing 100, and the third side wall 130 and the fourth side wall 140 are arranged at opposite sides of the first casing 100. The second casing 200 is mounted between the first side wall 110 and the second side wall 120, and mounted between the third side wall 130 and the fourth side wall 140. In other words, the second casing 200 is mounted in a space surrounded by the first to fourth side walls 110, 120, 130, 140. When the first casing 100 and the second casing 200 are combined, an accommodating space is formed between the first casing 100 and the second casing 200 for accommodating components of the electric lock 10, such as the driving module 30, the motor 40 and the control circuit 50.

The driving module 30 is configured to drive a predetermined mechanism in the electric lock 10 to move to perform a predetermined operation. For example, the predetermined mechanism can be a latch mechanism of the electric lock 10, and the driving module 30 is configured to drive the latch mechanism to move to perform a locking operation or an unlocking operation; or the predetermined mechanism can be a clutch mechanism of the electric lock 10, and the driving module 30 is configured to drive the clutch mechanism to move to perform a locking operation or an unlocking operation, but the present invention is not limited thereto. The motor 40 is connected to the driving module 30. When the motor 40 rotates, the motor 40 is configured to drive the driving module 30 to perform the aforementioned operations. The control circuit 50 is configured to control rotation of the motor according to control parameters of the motor 40 in order to further drive the driving module 30 to drive the predetermined mechanism to move.

In addition, the second casing 200 is formed with at least one first buckle structure 210 adjacent to the first side wall 110. In the present embodiment, the second casing 200 is formed with two first buckle structures 210 adjacent to the first side wall 110, but the present invention is not limited thereto. The first buckle structure 210 comprises a first elastic arm 212 extended along the height direction D1 of the second casing 200, and a first protrusion 214 protruded from the first elastic arm 212 and extended toward the first side wall 110. The first side wall 110 is formed with a first blocking part 112 configured to abut against the first protrusion 214 when the first casing 100 and the second casing 200 are combined in order to prevent the second casing 200 from moving away from the first casing 100 along the height direction D1. In the present embodiment, the first blocking part 112 is protruded from the first side wall 110, but the present invention is not limited thereto. In addition, an upper end of the first blocking part 112 is formed with a first upper inclined surface 114.

The second casing 200 is further formed with at least one second buckle structure 220 adjacent to the second side wall 120. In the present embodiment, the second casing 200 is formed with two second buckle structures 220 adjacent to the second side wall 120, but the present invention is not limited thereto. Similarly, the second buckle structure 220 comprises a second elastic arm 222 extended along the height direction D1 of the second casing 200, and a second protrusion 224 protruded from the second elastic arm 22 and extended toward the second side wall 120. The second side wall 120 is formed with a second blocking part 122 configured to abut against the second protrusion 224 when the first casing 100 and the second casing 200 are combined in order to prevent the second casing 200 from moving away from the first casing 100 along the height direction D1. In the present embodiment, the second blocking part 122 is protruded from the second side wall 120, but the present invention is not limited thereto. In addition, an upper end of the second blocking part 122 is formed with a second upper inclined surface 124.

Figure 5:
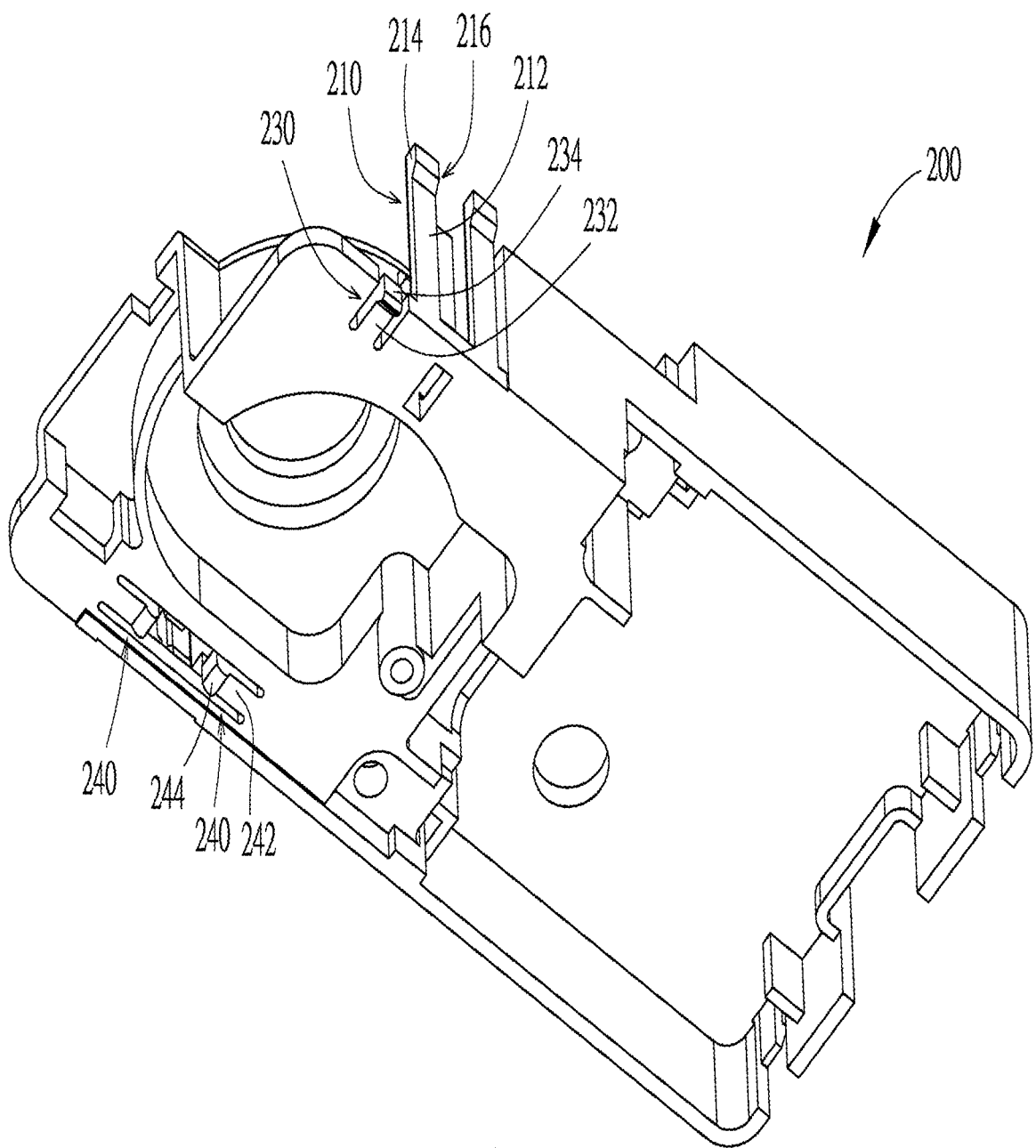
FIG. 5 is a diagram showing a second casing of the electric lock of the present invention.

Please refer to FIG. 5, and FIG. 1 to FIG. 4 as well. FIG. 5 is a diagram showing the second casing of the electric lock of the present invention. As shown in figures, the second casing 200 is further formed with at least one first rebound structure 230 adjacent to the first buckle structure 210, and at least one second rebound structure 240 adjacent to the second buckle structure 220. In the present embodiment, the second casing 200 is formed with one first rebound structure 230 adjacent to the first buckle structure 210, and two second rebound structures 240 adjacent to the second buckle structure 220, but the present invention is not limited thereto. In addition, the first rebound structure 230 comprises a first cantilever 232 and a first protrusion part 234 protruded from the first cantilever 232; the second rebound structure 240 comprises a second cantilever 242 and a second protrusion part 244 protruded from the second cantilever 242. In the present embodiment, the first buckle structure 210, the second buckle structure 220, the first rebound structure 230, and the second rebound structure 240 are integrally formed on the second casing 200. For example, the second casing 200 is formed by plastic injection molding.

Figure 6:
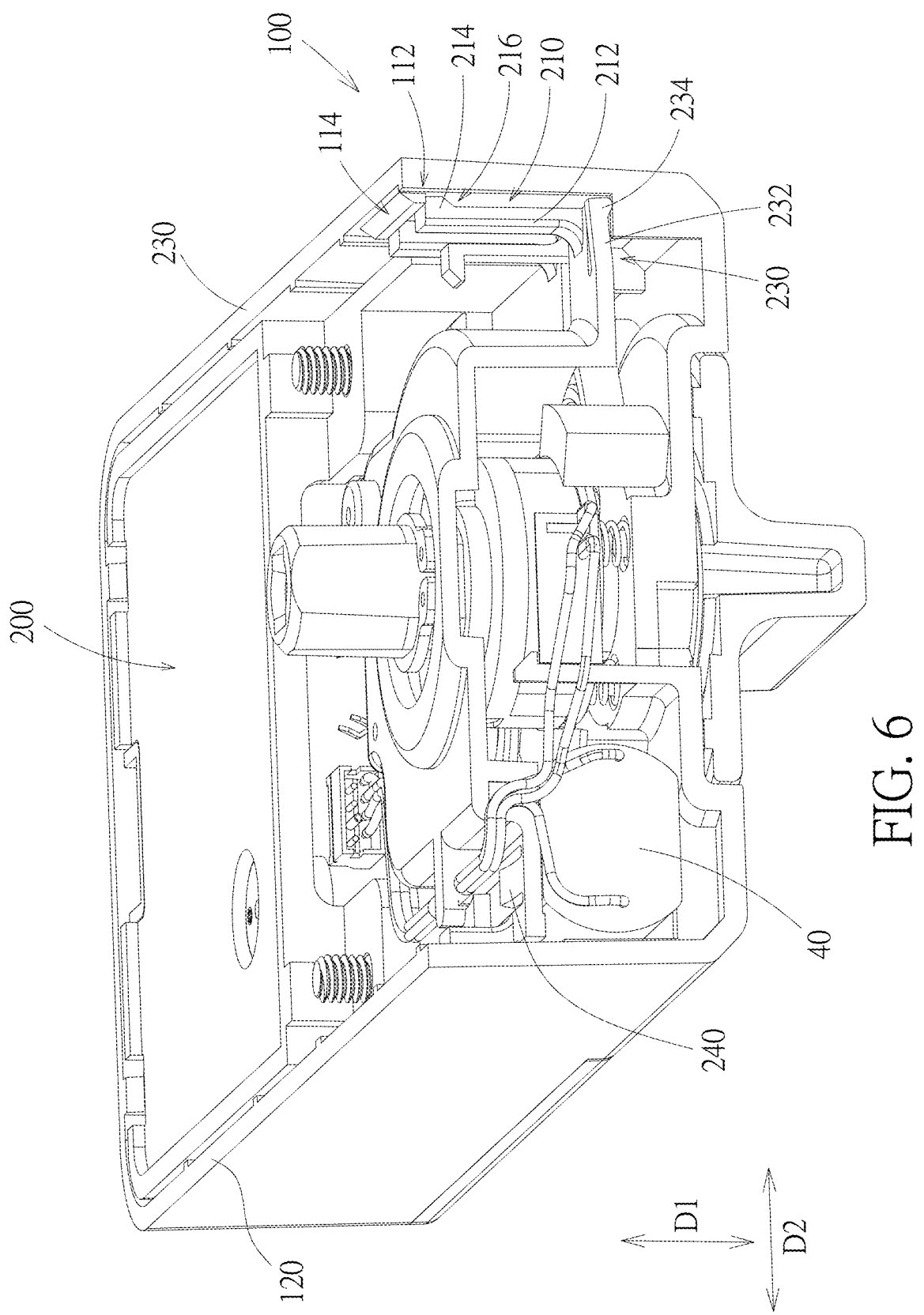
FIG. 6 is a diagram showing assembly of the housing of the electric lock of the present invention.
Figure 7:
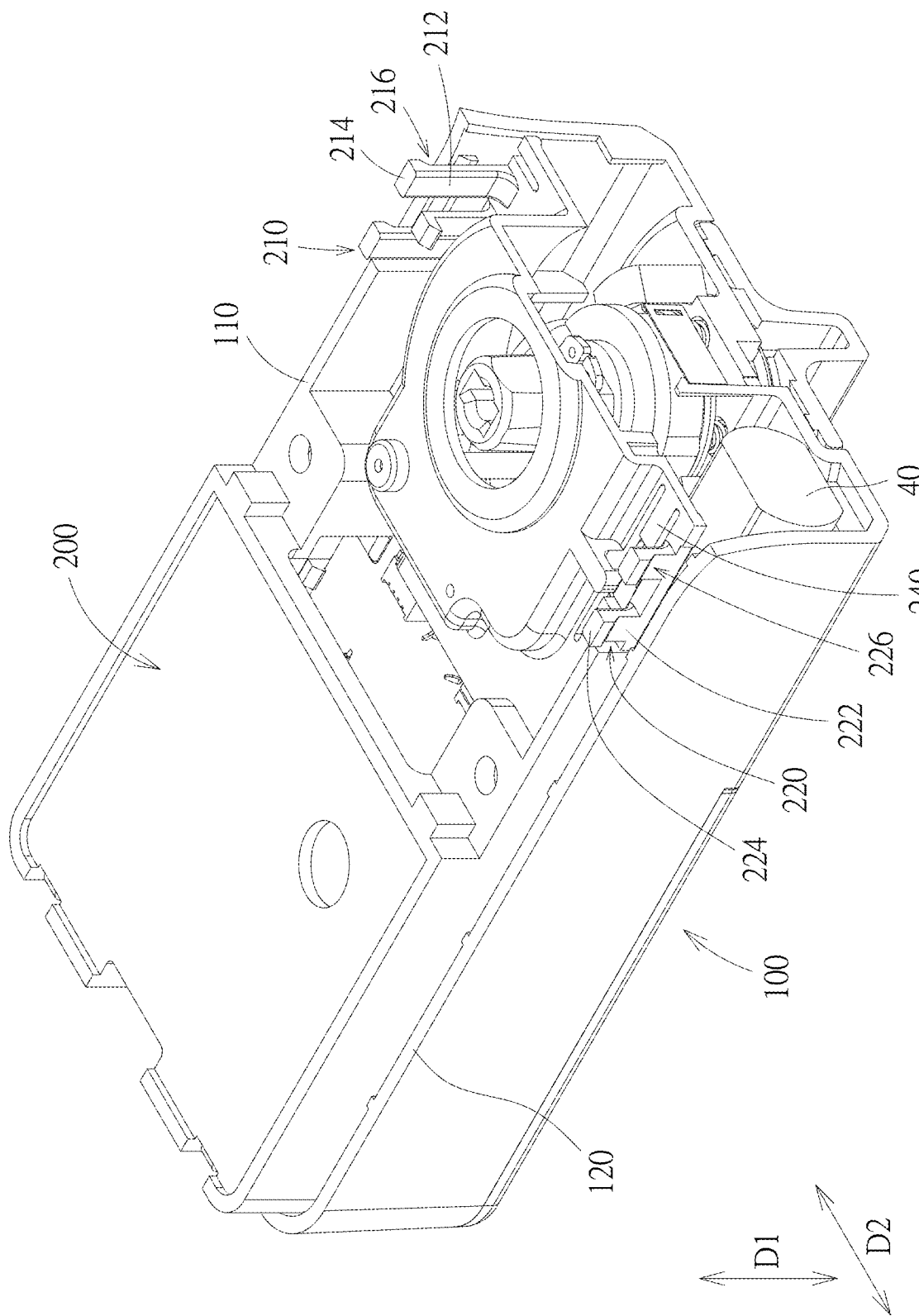
FIG. 7 is a diagram showing disassembly of the housing of the electric lock of the present invention.

Please refer to FIG. 6 and FIG. 7, and FIG. 1 to FIG. 5 as well. FIG. 6 is a diagram showing assembly of the housing of the electric lock of the present invention. FIG. 7 is a diagram showing disassembly of the housing of the electric lock of the present invention. When the first casing 100 and the second casing 200 are combined, the first protrusion part 234 of the first rebound structure 230 is configured to abut against the first casing 100 such that the first cantilever 232 is elastically deformed to accumulate an elastic force, and the second protrusion part 244 of the second rebound structure 240 is configured to abut against the motor 40 such that the second cantilever 242 is elastically deformed to accumulate an elastic force (as shown in FIG. 6). When the first side wall 110 and the second side wall 120 are pulled outward along a lateral direction D2 of the first casing 100, the first blocking part 112 no longer abuts against the first protrusion 214, and the second blocking part 122 no longer abuts against the second protrusion 224. Meanwhile, the first rebound structure 230 and the second rebound structure 240 are configured to provide the elastic forces along the height direction D1 to push the second casing 200 away from the first casing 100 along the height direction D1 (as shown in FIG. 7).

According to the aforementioned arrangement, during a process of dissembling the housing 20, a user only needs to pull the first side wall 110 and the second side wall 120 outward along the lateral direction D2 of the first casing 100, such that the second casing 200 can be automatically detached from the first casing 100 along the height direction D1. Therefore, the housing 20 of the electric lock of the present invention is easier to disassemble, and the first buckle structure 210 and the second buckle structure 220 are not easily broken or damaged during the disassembly process.

On the other hand, a lower end of the first protrusion 214 is formed with a first lower inclined surface 216 corresponding to the first upper inclined surface 114, and a lower end of the second protrusion 224 is formed with a second lower inclined surface 226 corresponding to the second upper inclined surface 124. Therefore, during an assembly process of the housing, the user only needs to press down the second casing 200 toward the first casing 100 along the height direction D1, such that the first protrusion 214 and the second protrusion 224 can easily cross the first blocking part 112 and the second blocking part 122 respectively through interaction between the first upper inclined surface 114 and the first lower inclined surface 216 and between the second upper inclined surface 124 and the second lower inclined surface 226 (and through elastic deformation of the first elastic arm 212 and the second elastic arm 222), so as to combine the first casing 100 and the second casing 200.

Moreover, when the first casing 100 and the second cover 200 are combined, the second rebound structure 240 is configured to abut against the motor 40. Therefore, the second rebound structure 240 can reduce vibration of the motor 40 during operation, so as to prevent a welding point between the motor 40 and a power cable from being damaged due to the vibration. In the present embodiment, the second rebound structures 240 are arranged along a longitudinal direction of the motor to respectively abut against two opposite ends of the motor 40, so as to improve vibration absorption effect.

In contrast to the prior art, the housing 20 of the electric lock 10 of the present invention can be easily dissembled and assembled, and the first buckle structure 210 and the second buckle structure 220 are not easily broken or damaged during the disassembly process. In addition, the second rebound structure 240 on the second casing 200 can abut against the motor 40 to reduce the vibration of the motor 40 during operation, thereby increasing stability and reliability of the electric lock 10 of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electric lock, comprising:
   a driving module;
   a motor connected to the driving module;
   a control circuit configured to control the motor to drive the driving module to drive a predetermined mechanism of the electric lock to move; and
   a housing, comprising:
      a first casing having a first side wall and a second side wall arranged at two opposite sides of the first casing; and
      a second casing mounted between the first side wall and the second side wall, wherein an accommodating space is formed between the first casing and the second casing and configured to accommodate the driving module, the motor and the control circuit;
   wherein the second casing is formed with a first buckle structure adjacent to the first side wall, and a first rebound structure configured to abut against the first casing to be elastically deformed to accumulate a first elastic force;
   wherein the first buckle structure comprises a first elastic arm extended along a height direction of the second casing, and a first protrusion protruded from the first elastic arm and extended toward the first side wall;
   wherein the first rebound structure is configured to provide the first elastic force along the height direction to push the second casing away from the first casing along the height direction when the first side wall and the second side wall are pulled outward along a lateral direction of the first casing to be away from the second casing;
   wherein the first side wall is formed with a first blocking part configured to abut against the first protrusion to prevent the second casing from moving away from the first casing along the height direction;
   wherein the second casing is further formed with a second buckle structure adjacent to the second side wall, and a second rebound structure configured to abut against the motor to be elastically deformed to accumulate a second elastic force;
   wherein the second buckle structure comprises a second elastic arm extended along the height direction of the second casing, and a second protrusion protruded from the second elastic arm and extended toward the second side wall;
   wherein the second rebound structure is configured to provide the second elastic force along the height direction to push the second casing away from the first casing along the height direction when the first side wall and the second side wall are pulled outward along the lateral direction of the first casing to be away from the second casing;
   wherein the second side wall is formed with a second blocking part configured to abut against the second protrusion to prevent the second casing from moving away from the first casing along the height direction.

2. The electric lock of claim 1, wherein the first blocking part is protruded from the first side wall, and an upper end of the first blocking part is formed with a first upper inclined surface.

3. The electric lock of claim 2, wherein a lower end of the first protrusion is formed with a first lower inclined surface corresponding to the first upper inclined surface.

4. The electric lock of claim 1, wherein the second blocking part is protruded from the second side wall, and an upper end of the second blocking part is formed with a second upper inclined surface.

5. The electric lock of claim 4, wherein a lower end of the second protrusion is formed with a second lower inclined surface corresponding to the second upper inclined surface.

6. The electric lock of claim 1, wherein the first rebound structure is adjacent to the first buckle structure, and the second rebound structure is adjacent to the second buckle structure.

7. The electric lock of claim 6, wherein the second casing is formed with two second rebound structures along a longitudinal direction of the motor to respectively abut against two opposite ends of the motor.

\* \* \* \* \*